United States Patent
Jonsson

(10) Patent No.: US 8,781,769 B2
(45) Date of Patent: *Jul. 15, 2014

(54) NETWORKED DEVICE WITH POWER USAGE ESTIMATION

(71) Applicant: Greenwave Reality, PTE, Ltd., Singapore (SG)

(72) Inventor: Karl Jonsson, Rancho Santa Margarita, CA (US)

(73) Assignee: Greenwave Reality PTE Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/902,981

(22) Filed: May 28, 2013

(65) Prior Publication Data

US 2013/0311114 A1 Nov. 21, 2013

Related U.S. Application Data

(63) Continuation of application No. 12/795,417, filed on Jun. 7, 2010, now Pat. No. 8,452,554.

(60) Provisional application No. 61/261,707, filed on Nov. 16, 2009, provisional application No. 61/254,709, filed on Oct. 25, 2009.

(51) Int. Cl.

| | | |
|---|---|---|
| *G01R 21/00* | (2006.01) | |
| *H01R 25/00* | (2006.01) | |
| *G01R 21/133* | (2006.01) | |
| *H01R 13/66* | (2006.01) | |
| *G01D 4/00* | (2006.01) | |
| *H01R 13/703* | (2006.01) | |
| *H02J 3/14* | (2006.01) | |
| *G06F 1/32* | (2006.01) | |
| *H02J 13/00* | (2006.01) | |

(52) U.S. Cl.
CPC ............ *G01R 21/133* (2013.01); *H01R 25/003* (2013.01); *Y02B 90/241* (2013.01); *Y04S 20/32* (2013.01); *H01R 13/6683* (2013.01); *G01D 4/002* (2013.01); *H01R 13/703* (2013.01); *Y04S 20/16* (2013.01); *Y04S 20/38* (2013.01); *Y04S 20/40* (2013.01); *Y04S 20/222* (2013.01); *H02J 3/14* (2013.01); *Y02B 90/245* (2013.01); *G06F 1/3209* (2013.01); *Y02B 90/226* (2013.01); *H02J 2003/143* (2013.01); *Y02B 70/3225* (2013.01); *H02J 13/0062* (2013.01)
USPC .................. 702/62; 702/60; 702/61; 702/64

(58) Field of Classification Search
USPC .......................................................... 702/62
See application file for complete search history.

(56) References Cited

U.S. PATENT DOCUMENTS

| | | |
|---|---|---|
| 4,858,141 A | 8/1989 | Hart et al. |
| 5,258,656 A | 11/1993 | Pawlick |

(Continued)

FOREIGN PATENT DOCUMENTS

| | | |
|---|---|---|
| WO | 03026358 A1 | 3/2003 |
| WO | 2009084016 A2 | 7/2009 |

(Continued)

OTHER PUBLICATIONS

Fujikom's LED business, World Wide Web site http://www.fujikom.com/en/products/led/, Retrieved on Jul. 19, 2010.

(Continued)

*Primary Examiner* — Sujoy Kundu
*Assistant Examiner* — Paul D Lee
(74) *Attorney, Agent, or Firm* — Bruce A. Young

(57) ABSTRACT

A request for energy usage status is received by a networked device over a network. A set of power usage data is retrieved from a non-volatile memory located within the networked device. The set of power usage data, which includes information related to power usage of the networked device, was previously stored in the non-volatile memory in advance of positioning the networked device for normal use. A best estimate of the energy usage status of the networked device is calculated based, at least in part, on the set of power usage data retrieved from the non-volatile memory without measuring electrical parameters of a power source of the networked device during normal use. The best estimate of the energy usage status is then sent by the networked device over the network as a reply to the energy usage status request.

28 Claims, 8 Drawing Sheets

(56) References Cited

U.S. PATENT DOCUMENTS

| | | |
|---|---|---|
| 5,301,122 A | 4/1994 | Halpern |
| 5,483,153 A | 1/1996 | Leeb et al. |
| 5,650,771 A | 7/1997 | Lee |
| 5,717,325 A | 2/1998 | Leeb et al. |
| 5,754,963 A | 5/1998 | Nunneley et al. |
| 6,476,729 B1 | 11/2002 | Liu |
| 6,492,897 B1 | 12/2002 | Mowery |
| 6,528,954 B1 | 3/2003 | Lys et al. |
| 6,987,444 B2 | 1/2006 | Bub et al. |
| 6,993,417 B2 | 1/2006 | Osann |
| 7,014,336 B1 | 3/2006 | Ducharme et al. |
| 7,579,711 B2 | 8/2009 | Menas et al. |
| 7,651,245 B2 | 1/2010 | Thomas et al. |
| 7,772,718 B2 | 8/2010 | Lee et al. |
| 7,885,917 B2 | 2/2011 | Kuhns et al. |
| 7,961,111 B2 | 6/2011 | Tinaphong et al. |
| 7,970,542 B2 | 6/2011 | Bent et al. |
| 8,013,545 B2 | 9/2011 | Jonsson |
| 8,138,626 B2 | 3/2012 | Jonsson et al. |
| 8,185,333 B2 | 5/2012 | Jonsson et al. |
| 8,421,376 B2 | 4/2013 | Jonsson |
| 8,430,402 B2 | 4/2013 | Diehl et al. |
| 8,531,137 B2 | 9/2013 | Jonsson |
| 2003/0050737 A1 | 3/2003 | Osann |
| 2004/0066652 A1 | 4/2004 | Hong |
| 2006/0202557 A1 | 9/2006 | Menas et al. |
| 2006/0271544 A1 | 11/2006 | Devarakonda et al. |
| 2007/0135973 A1 | 6/2007 | Petite |
| 2007/0297112 A1 | 12/2007 | Gilbert |
| 2008/0094210 A1 | 4/2008 | Paradiso et al. |
| 2009/0059602 A1 | 3/2009 | Santos et al. |
| 2009/0204916 A1 * | 8/2009 | Benedek et al. ............... 715/764 |
| 2009/0234512 A1 | 9/2009 | Ewing et al. |
| 2009/0236909 A1 | 9/2009 | Aldag et al. |
| 2009/0254909 A1 | 10/2009 | Hanson et al. |
| 2009/0267540 A1 | 10/2009 | Chemel et al. |
| 2009/0322159 A1 | 12/2009 | DuBose et al. |
| 2010/0005331 A1 | 1/2010 | Somasundaram et al. |
| 2010/0084992 A1 | 4/2010 | Valois et al. |
| 2010/0090542 A1 | 4/2010 | Johnson et al. |
| 2010/0141153 A1 | 6/2010 | Recker et al. |
| 2010/0145542 A1 | 6/2010 | Chapel et al. |
| 2010/0191487 A1 | 7/2010 | Rada et al. |
| 2011/0031819 A1 | 2/2011 | Gunwall |
| 2011/0062874 A1 | 3/2011 | Knapp |
| 2011/0248640 A1 | 10/2011 | Welten |

FOREIGN PATENT DOCUMENTS

| | | |
|---|---|---|
| WO | 2009097400 A1 | 8/2009 |
| WO | 2011050013 A2 | 4/2011 |

OTHER PUBLICATIONS

Hart, G. W., Nonintrusive appliance load monitoring, Porceedings of the IEEE, vol. 80, No. 12, Dec. 1, 1992, pp. 1870-1891, IEEE, New York, NY, US.

International Search Report and Written Opinion for PCT/US2010/053286, European Patent Office, Jul. 7, 2011.

A. Prudenzi, A Neuron Nets Based Procedure for Identifying Domestic Appliances Pattern of Use from Energy Recordings at Meter Panel, IEEE, 2002.

* cited by examiner

NETWORKED DEVICE WITH POWER USAGE ESTIMATION

CROSS-REFERENCE TO RELATED APPLICATIONS

This application is a continuation of U.S. patent application Ser. No. 12/795,417, now U.S. Pat. No. 8,452,554, which claims the benefit of U.S. Prov. Appl. No. 61/254,709 entitled "HYBRID LIGHT" filed on Oct. 25, 2009, and U.S. Prov. Appl. No. 61/261,707 entitled "AUTOMATED LOAD ASSESSMENT DEVICE" filed Nov. 16, 2009. The entire contents of the three aforementioned applications are hereby incorporated by reference.

BACKGROUND

1. Technical Field

The present subject matter relates to home automation networking. It further relates to the monitoring and reporting by networked devices of their power or energy usage.

2. Description of Related Art

Providing home automation functionality using networking means is well known in the art. Control of lighting and appliances can be accomplished using systems from many different companies such as X10, Insteon® and Echelon.

In U.S. Pat. No. 6,528,954, inventors Lys and Mueller describe a smart light bulb which may include a housing, an illumination source, disposed in the housing, and a processor, disposed in the housing, for controlling the illumination source. The housing may be configured to fit a conventional light fixture. The illumination source may be an LED system or other illumination source. The processor may control the intensity or the color of the illumination source. The housing may also house a transmitter and/or receiver. The smart light bulb may respond to a signal from another device or send a signal to another device. The other device may be another smart light bulb or another device. They go on to describe a modular LED unit which may be designed to be either a "smart" or "dumb" unit. A smart unit, in one embodiment, includes a microprocessor incorporated therein for controlling, for example, a desired illumination effect produced by the LEDs. The smart units may communicate with one another and/or with a master controller by way of a network formed through the mechanism for electrical connection described above. It should be appreciated that a smart unit can operate in a stand-alone mode, and, if necessary, one smart unit may act as a master controller for other modular LED units. A dumb unit, on the other hand, does not include a microprocessor and cannot communicate with other LED units. As a result, a dumb unit cannot operate in a stand-alone mode and requires a separate master controller. The smart light bulb may be associated with a wide variety of illumination applications and environments.

Ducharme et al., in U.S. Pat. No. 7,014,336, describe systems and methods for generating and/or modulating illumination conditions to generate high-quality light of a desired and controllable color, for creating lighting fixtures for producing light in desirable and reproducible colors, and for modifying the color temperature or color shade of light within a prespecified range after a lighting fixture is constructed. In one embodiment, LED lighting units capable of generating light of a range of colors are used to provide light or supplement ambient light to afford lighting conditions suitable for a wide range of applications. They go on to describe a networked lighting system. U.S. Pat. No. 7,651,245 invented by Thomas, et al., shows an LED light fixture with internal power supply. They describe some embodiments where a radio frequency control unit can receive commands from a centralized controller, such as that provided by a local network, or from another control module positioned in a fixture in close proximity. Thus, the range of the lighting network could be extended via the relaying and/or repeating of control commands between control units.

Neither Lys and Mueller, Ducharme et al. nor Thomas, et al. discuss monitoring or reporting the power consumed in their smart light bulb.

Inventors Chemel et al. show a method and system for designing improved intelligent, LED-based lighting systems. The LED based lighting systems may include fixtures with one or more of rotatable LED light bars, integrated sensors, onboard intelligence to receive signals from the LED light bars and control the LED light bars, and a mesh network connectivity to other fixtures. In at least one embodiment, light fixtures or associated control systems may measure the electricity they've consumed, and report it back to a utility for billing purposes. In another embodiment, the operator user interface may be adapted to provide an operator of the environment with tools for visualizing the energy consumed by at least one of the lighting systems.

The system described by Chemel et al. requires expensive sensors to measure the electricity that has been consumed. Measuring the energy consumed and reporting it to the user or home owner is becoming more important over time as more and more people want to make their lifestyle more "green" and carefully monitor and control their energy usage. At the same time, home automation is becoming more prevalent and easier to use. Devices enabled for home automation include control and communication means allowing the devices to include more functionality. So it is becoming very important to enable devices to report their own energy usage as accurately as possible while adding as little cost as possible to individual devices or to the home in general.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Some descriptive terms and phrases are presented in the following paragraphs for clarity.

The term "LED" refers to a diode that emits light, whether visible, ultraviolet, or infrared, and whether coherent or incoherent. The term as used herein includes incoherent polymer-encased semiconductor devices marketed as "LEDs", whether of the conventional or super-radiant variety. The term as used herein also includes semiconductor laser diodes and diodes that are not polymer-encased. It also includes LEDs that include a phosphor or nanocrystals to change their spectral output.

The term "energy usage status" refers to any parameter that could be useful in determining the energy used by a networked device. Specifically included in the definition are the instantaneous power used by the networked device at the current or any previous point of time, and the energy used by the networked device over an explicit or implicit period of time.

The term "network" refers to a bidirectional communication medium and protocol to allow a plurality of devices to communicate with each other.

The term "networked device" refers to any device that can communicate over a network.

The terms "networked light fixture", "networked lighting apparatus" and "networked light bulb" all refer to a networked device capable of emitting light. While there are subtle differences in the generally agreed upon embodiments for these terms, they may be used interchangeably in this disclosure unless additional detail is provided to indicate that a specific embodiment is being discussed.

Reference now is made in detail to the examples illustrated in the accompanying drawings and discussed below.

Figure 1:
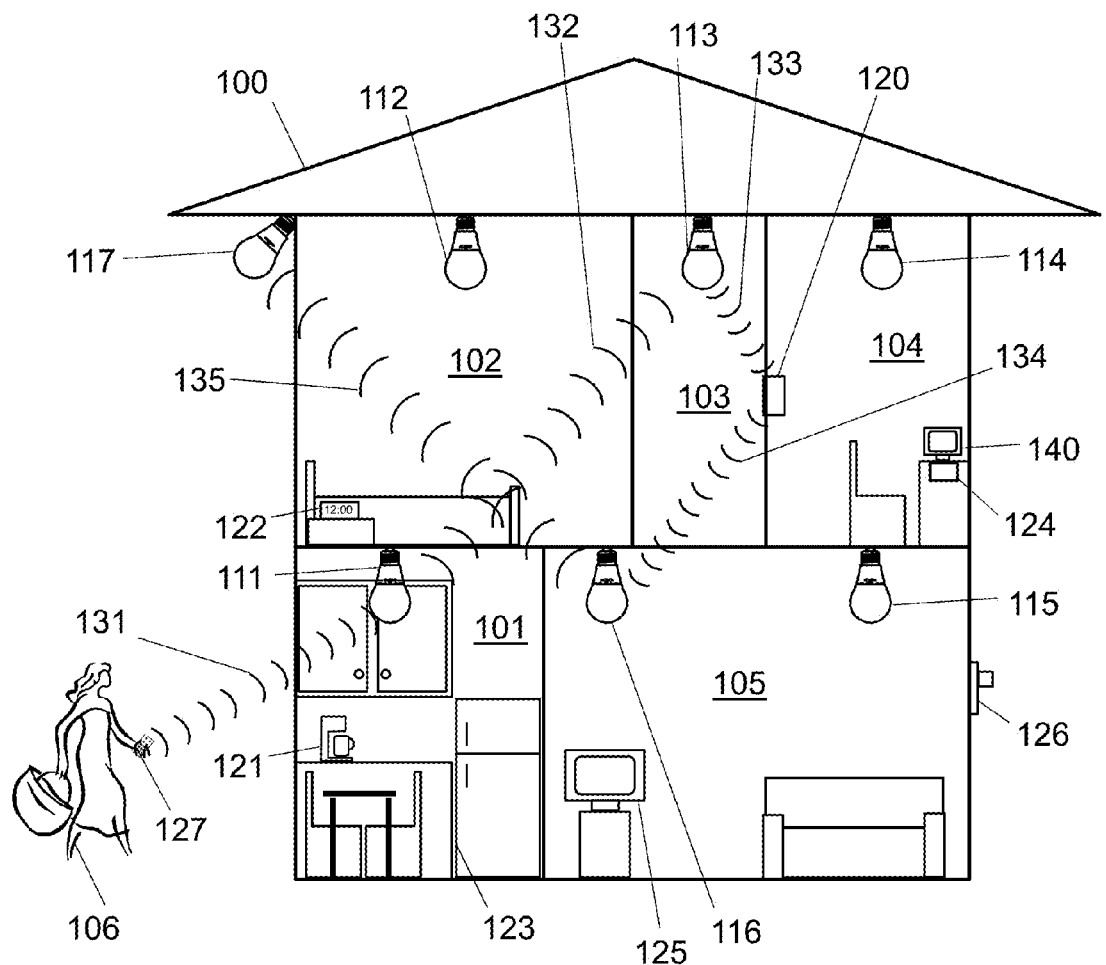
FIG. 1 shows a stylized view of a home with a plurality of networked home automation devices.

FIG. 1 shows a stylized view of a home 100 with a plurality of home networked devices 111-127. In the embodiment shown, the networked devices communicate over a wireless mesh network such as Z-wave or Zigbee (IEEE 802.15.4). Other wireless networks such as Wi-Fi (IEEE 802.11) might be used in a different embodiment. In other embodiments, a power line network such as X10 or HomePlug. In additional embodiments, a wired network could be used such as Ethernet (IEEE 802.3). In other embodiments, an optical network might be employed and some embodiments may utilize a heterogeneous network with multiple types of networks. This exemplary home has five rooms. The kitchen 101 has a networked light fixture 111, a networked coffee maker 121 and a networked refrigerator 123. The bedroom 102 has a networked light fixture 112, and a networked clock radio 122. The hallway 103 has a networked light bulb 113. The home office 104 has a networked light fixture 114, a network controller 120, and a home computer 140 connected to a network gateway 124. The living room 105 has two networked light fixtures 115, 116 and a networked television 125. External to the home is a networked floodlight 117 and a networked electric meter 126. Homeowner 106 is returning to her home with a networked remote control 127 and decides to turn on a networked floodlight 117 to light her way.

Figure 2:
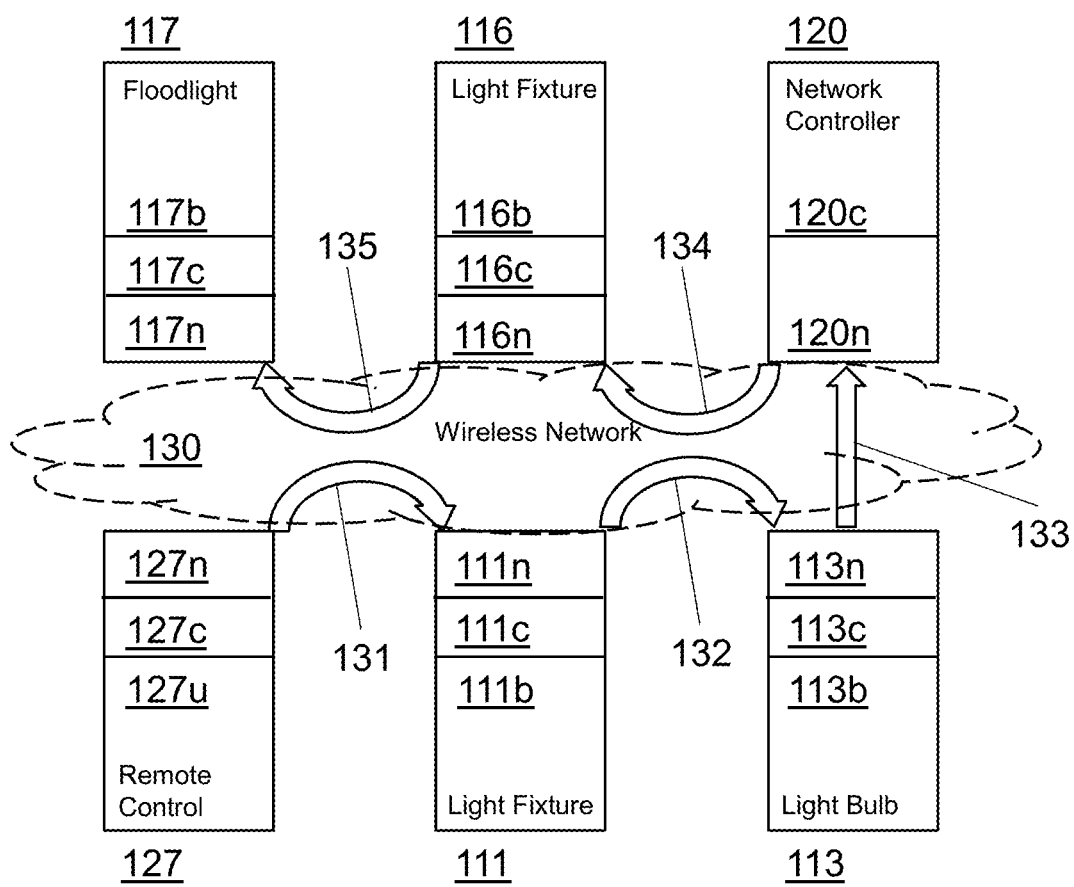
FIG. 2 shows a block diagram view of a network of home automation devices.

FIG. 2 shows a block diagram view of the automated home 100 showing only those devices involved with this particular instance of turning on the networked floodlight 117. The network 130 in this embodiment is a wireless mesh network meaning that individual devices can communicate with each other and that messages may be passed between intermediate devices to be able to reach its intended destination. In some cases, a message may be passed to a central network controller for processing but in other cases, a message may pass from an initiating device directly to a target device without involving the network controller. In the particular instance where the homeowner 106 presses a button 127u on the remote control 127, a controller 127c within the remote control 127 interprets the button press and creates a network message describing the task being requested. In this embodiment, the network message needs to be routed through the network controller 120 so the message created by the remote control controller 127c sets that up as the target of the message and passes the message to the network adapter 127n of the remote control 127. The network adapter 127n is unable to send the message directly to the network controller 120 so it sends a radio frequency network message 131 to the nearest networked device that is within range, is currently powered on, and has the capability to route the message 131 to another networked device to get it to the network controller 120. In this case, the coffee maker 121 happens to be off and the refrigerator 123 does not happen to have routing capability, so the radio frequency message 131 is accepted by the network adapter 111n of networked light fixture 111. The controller 111n in the networked light fixture 111 determines that the message 131 is not intended to turn on its LEDs 111b and it needs to be routed to the network controller 120 but the networked light fixture 111 and the network controller 120 are not able to directly communicate due to distance or interference so the controller 111c uses network adapter 111n to pass the message 131 to networked light bulb 113 as radio frequency message 132. The network adapter 113n and controller 113c determine that the message is not meant to turn on the LEDs 113b in the networked light bulb 113, and it is able to directly communicate with the network controller 120, so the controller 113c uses the network adapter 113n to send a radio frequency message 133 to the network controller 120.

The network adapter 120n of the network controller 120 accepts the message 133 and passes it to the controller 120c. It then interprets the command which may have multiple functions to perform such as adjusting the temperature of the home, disarming an alarm or other functions that are not specified here. But one function that is required is to turn on floodlight 117. So the controller 120c creates a message telling the floodlight 117 to turn on and has the network adapter 120n send it to the light fixture 116 because the floodlight 117 is out of range of the network controller 120. So the message 134 is passed to the light fixture 116 using its network adapter 116n and controller 116c and without turning on its light 116b. The light fixture 116 is within communication range of the floodlight 117 so it sends the message 135 to the floodlight 117. The network adapter 117n receives the message and passes it to the controller 117c which interprets the message and turns on the light 117b so that the homeowner 106 can find her way to the door.

Figures 3A, 3B:
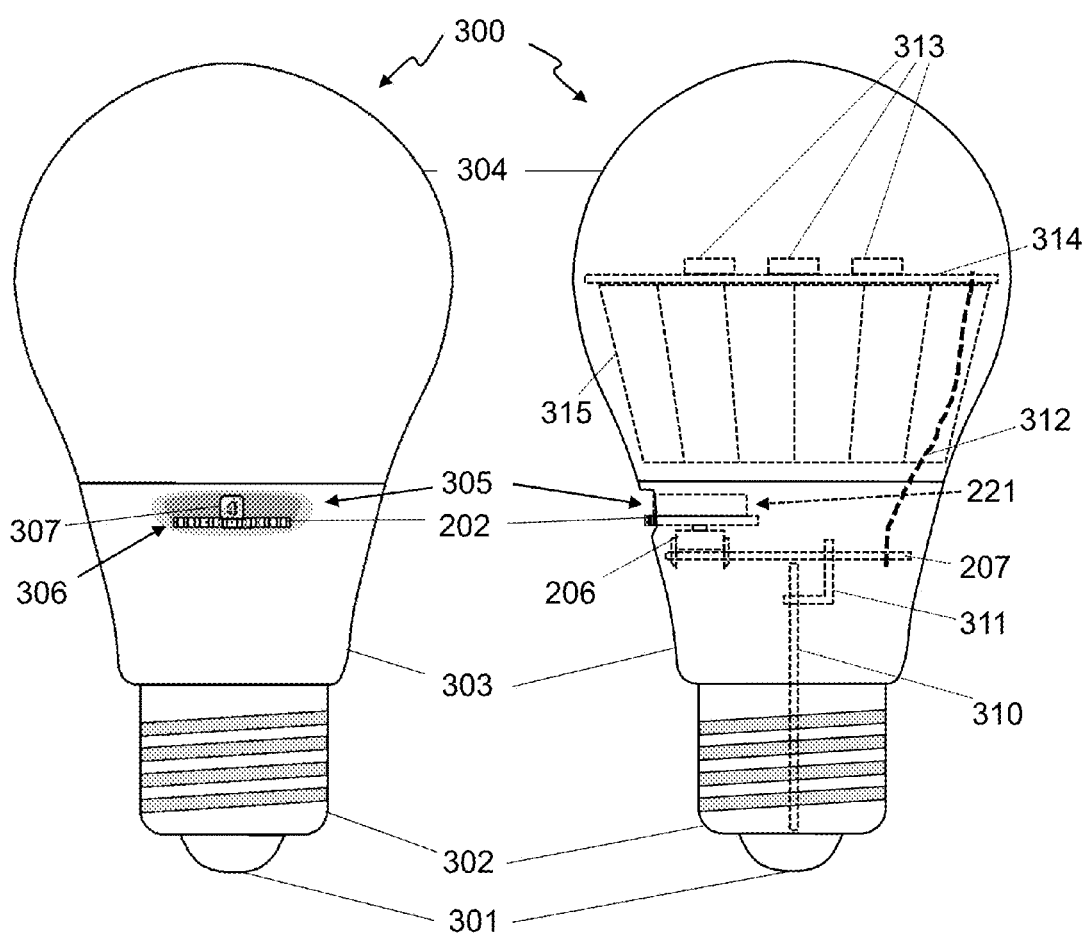
FIGS. 3A and 3B show a networked light bulb.

FIG. 3A shows a front view (with inner structure not shown) and FIG. 3B shows a side view (with selected inner structure shown in broken lines) of a networked light bulb 300. In this embodiment a networked light bulb 300 is shown but other embodiments of the present subject matter could be a permanently installed light fixture with a socket for a standard light bulb, or a light fixture with embedded LEDs or any other sort of light emitting apparatus. It is also representative of any other type of networked device such as the networked coffee maker 121, the networked refrigerator 123, the networked clock radio 122, the networked television 125 or any other type of device that may participate in a home automation network. The light bulb 300 is AC powered but other embodiments could be battery powered or solar powered. The networked light bulb 300 of this embodiment has a base with a power contact 301 and a neutral contact 302, a middle housing 303 and an outer bulb 304. Each section 301, 302, 303, 304 can be made of a single piece of material or be assembled from multiple component pieces. The outer bulb 304 is at least partially transparent and may have ventilation openings in some embodiments, but the other sections 301, 302, 303 can be any color or transparency and be made from any suitable material. The middle housing 303 has an indentation 305 with a slot 306 and an aperture 307. A color wheel 221 is attached to the shaft of rotary switch 206 which is mounted on a printed circuit board 207. The printed circuit board 207 with the color wheel 221 is mounted horizontally so that the edge 202 of the color wheel protrudes through the slot 306 of the middle housing 303. This allows the user to apply a rotational force to the color wheel 221. As the color wheel 221 rotates, different sections of the colored area of the color wheel 221 are visible through an aperture 307. In FIG. 3, the current position of the color wheel 221 is such the color section with color 4 is visible through the aperture 307, indicating that the user has selected color 4 at this time. The color selection mechanism 428 may be designed to provide a detent at each section of the colored area to make it clear what color is currently selected.

In this embodiment, a second printed circuit board 310 is mounted vertically in the base of the networked light bulb 300. A board-to-board connection 311 is provided to connect selected electrical signals between the two printed circuit boards 207, 310. A third printed circuit board 314 has a plurality of LEDs 313 mounted on it and is backed by a heat sink 315 to cool the plurality of LEDs 313. In some embodiments the third printed circuit board 314 with a plurality of LEDs 313 may be replaced by a single multi-die LED package or a single high output LED. In some embodiments the heat sink 315 may not be needed or could be a completely different configuration than what is shown. A cable 312 connects the printed circuit board 207 with the third printed circuit board 314. The cable 312 carries the power for the plurality of LEDs 313. In some embodiments it may be connect the second printed circuit board 310 directly to the third printed circuit board 314 instead of passing the signals through the printed circuit board 207.

Figure 4:
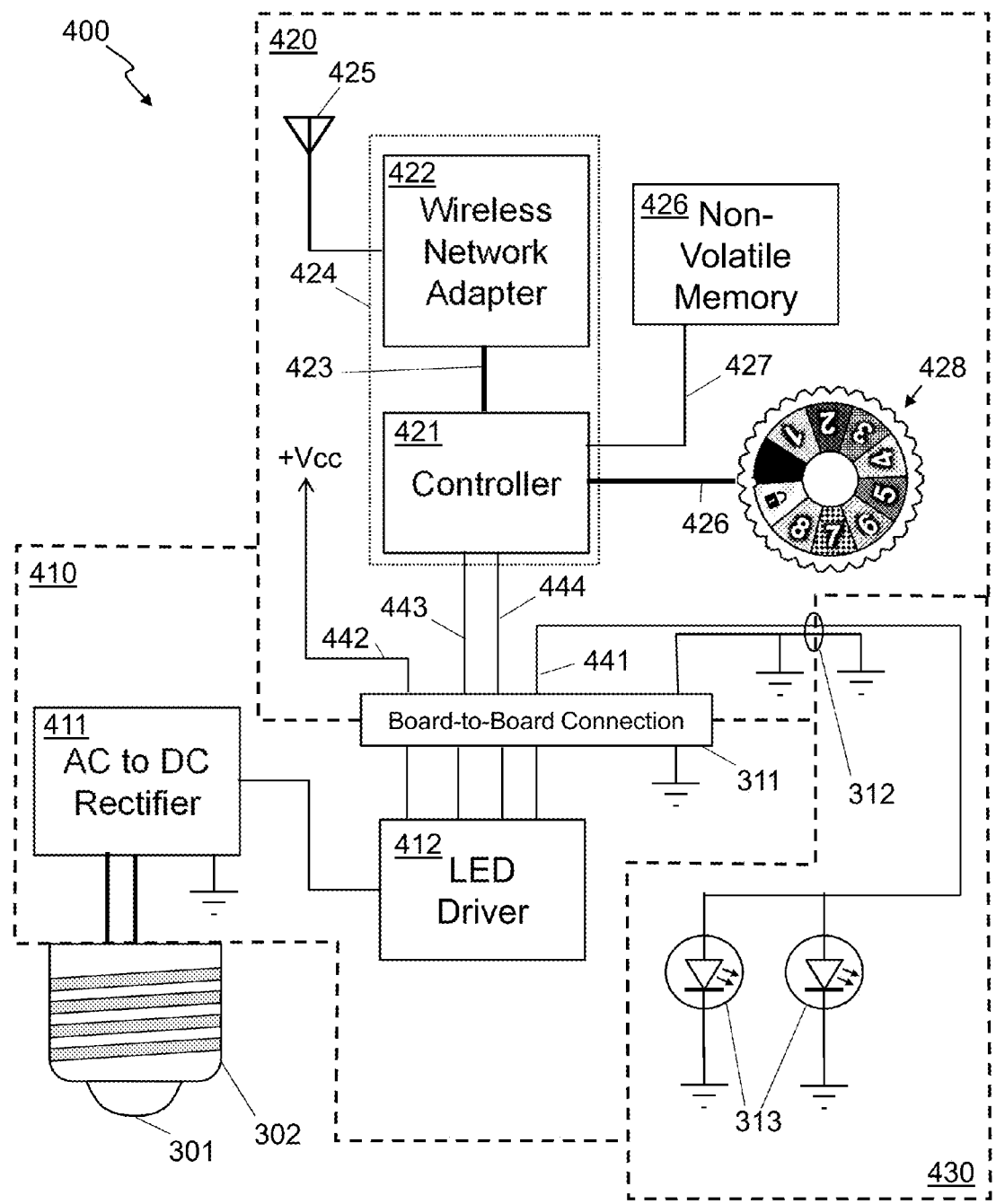
FIG. 4 shows a block diagram of the electronics utilized in one embodiment of the networked light bulb.

FIG. 4 shows a block diagram of the control electronics 400 used in the networked light bulb 300. While the following discussion directed primarily at the embodiment of a networked light bulb 300 the same principles and concepts can be applied by one skilled in the art to any other networked device. The block diagram is divided into three sections 410, 420, 430 corresponding to the three printed circuit boards of FIG. 3. Other embodiments may partition the system differently and have more or fewer printed circuit boards or circuit elements. The three sections are the LED Driver section 410, corresponding to the second printed circuit board 310, the networked controller section 420, corresponding to the printed circuit board 207, and the LED section 430, corresponding to the third printed circuit board 314, The base with contacts 301, 302 provides AC power to the AC to DC rectifier 411 to power the LED driver 412. The LED driver may be an integrated circuit such as the NXP SSL2101 or similar parts from Texas Instruments or others. Several signals are shared in common between the LED driver section 410 and the networked controller section 420 through a board-to-board connection 311. The board-to-board connection 311 may be a pin and socket connector system, an edge finger connector system, soldered right angle pins, a cable, or any other method of connecting two boards. The shared signals comprise a ground connection, the LED power signal 441, a regulated power voltage 442, a control signal 443 and a serial communication signal 444. In some embodiments, the regulated power voltage 442 may be sufficient to power all the electronics in the networked controller section 420. In other embodiments, where more power is needed, a DC to DC converter may be included in the networked controller section 420 running off the LED power signal 441. The ground signal and the LED power signal 441 are then sent from the networked controller section 420 to the LED section 430 over cable 312. The LED section 430 may have a plurality of LEDs 313 powered by the LED power signal 441. The LED driver section 410 and LED section 430 could correspond to other sections that transform and consume electrical power or perform operations of a different embodiment of a networked device 300, such as the heating element of a networked coffee maker 121, under the control of the networked controller section 420.

The networked controller section 420 would be very similar in any embodiment of a networked device. It has a wireless network adapter 422 that receives radio frequency signals through antenna 425 and is connected to controller 421 by a digital bus 423. In some embodiments, the wireless network adapter 422 may connect to a Z-wave, Zigbee (IEEE 802.15.4) or Wi-Fi (IEEE 802.11) wireless network. Other embodiments may use a wired or power line network adapter instead of a wireless network adapter. In some embodiments, the controller 421 is implemented as a microcontroller and in some embodiments, the controller 421, wireless network adapter 422, and digital bus 423 may be integrated onto a single chip 424 such as the Zensys ZM3102. In some embodiments a timer or clock function is included in the networked controller 420. The timer or clock function could be implemented as a separate chip, a hardware block within the controller 421, a firmware function within the controller 421, or any other way of implementing a timer or clock function. A user interface such as a color selection mechanism 428 may also be connected to the controller 421 providing rotational position information through an electrical connection 426. In other embodiments a user interface may be provided using other means such as a graphical user interface on a display or a keypad or buttons or any other device or combination of devices that allows the user to make a selection and provide information on the selection to the controller 421. A non-volatile memory 426 also may be included in the networked controller section 420. The non-volatile memory 426 can be a flash memory, an EPROM, a battery-backed up RAM, a hard drive, or any other sort of memory device that retains its contents through a power cycle. The non-volatile memory 426 can be implemented as a single integrated circuit, a set of integrated circuits, a block of memory cells integrated with another function such as the controller 421 or the wireless network adapter 422 or any other implementation. The non-volatile memory 426 is connected to the controller through a digital connection 427. The digital connection could be an I2C bus, an SPI bus, a parallel connection, an internal bus within an integrated circuit, or any other electrical connections means, using a standard or proprietary protocol.

The non-volatile memory 426 can contain any number of different data depending on the embodiment including program instructions for the controller 421, configuration information for the networked device, temporary data for the program running on the controller 421, a log of different operating conditions of the networked device over time, networking settings or any other digital information useful in a specific embodiment. Some embodiments have a set of power usage data stored in the non-volatile memory 426. The set of power usage data has at least one data point indicating the amount of power used by the networked device such as the networked light bulb 300. In some embodiments, the set of power usage data has multiple data points of the power used corresponding to different operating conditions of the networked device. In some embodiments, the operating condition parameters are explicitly stored with the power data points. In other embodiments, the operating condition associated with each data point is implicitly understood by the controller 421 so only a set of power data points is stored. In one embodiment, the different operating conditions of the networked light bulb 300 are different brightness levels of the LEDs 313. In one embodiment, the brightness levels are explicitly stored with the power level as paired data points such as (25, 1.3), (50, 2.0), (75, 2.5), (100, 2.8) indicating that the networked light bulb 300 uses 1.3 W of power when the LEDs 313 are set to a 25% brightness level, 2.0 W of power when the LEDs 313 are set to a 50% brightness level, 2.5 W when the LEDs 313 are set to a 75% brightness level and 2.8 W when the LEDs are set to a 100% brightness level. In another embodiment, the set of power usage data for the networked light bulb 300 is simply a set of 11 data points such as (0.02, 0.7, 1.0, 1.4, 1.8, 2.0, 2.2, 2.4, 2.6, 2.7, 2.8) corresponding to the power used by the networked light bulb 300 at "Standby" (Dark), 10%, 20%, 30%, 40%, 50%, 60%, 70% 80%, 90% and 100% brightness, the brightness levels understood implicitly by the controller. In other embodiments, the set of power usage has two data points such as (0.02, 2.8) corresponding to a standby power usage and a full power usage. And in at least one other embodiment, only a single power usage data point is stored to represent the best overall estimate of power used whenever the device is in use.

In some embodiments, the set of power usage data is determined based on design data, qualification test data, data from the LED supplier, life testing, best guess by an engineer or some other method that does not involve measuring the power used by the particular networked device in question. In some embodiments, the data is calculated and then used for each and every instantiation of that particular design built. In other embodiments, each individual networked device is tested and power usage data collected for one or more operating conditions at the time of manufacturing, final product test, final packaging or sometime before it is sold to the end customer, and that measured data from that individual device is used to create the set of power usage data that is stored in the non-volatile memory 426 of the individual networked device.

In some embodiments, the controller 421 controls the brightness of the plurality of LEDs 313 by driving the control signal 443 back to the LED driver 412. In one embodiment the controller 421 may simply drive the control signal 443 low to turn the plurality of LEDs 313 on and drive the control signal 443 high to turn the plurality of LEDs 313 off. In other embodiments, the controller 421 may drive the control signal 443 with a pulse-width modulated signal to control the brightness of the plurality of LEDS 313. In some embodiments, the LED driver section 410 is designed to accept power that has been controlled by a standard thyristor-based light dimmer which varies the phase where the AC power is active. This can interact with the dimming control taking place over the network. To determine the current dimming level of the LEDs 313, the networked controller section 420 may, in some embodiments, include circuitry to monitor the LED power signal 441 to determine the amount of dimming taking place.

In other embodiments, the controller 421 may communicate with the LED driver 412 over the serial communications signal 444 to query and perhaps override the current dimming level. The serial communication signal 444 may also be used to communicate the current operating condition of the networked device, actual measured power used if the additional circuitry to measure power is included in the networked device, color temperature control, device temperature information or any other status or control information that might need to be communicated between the controller 421 and the LED driver 412 in a particular embodiment. The serial communication signal 444 may be implemented with a unidirectional or a bidirectional communication protocol such as RS-232, I2C, USB, SPI or any other standard or proprietary protocol.

Figure 5A:
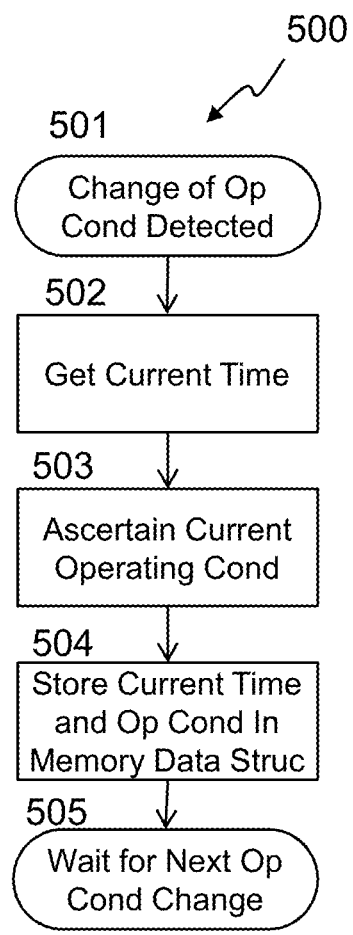
FIGS. 5A and 5B are flowcharts of the how a log of device operating conditions may be maintained.
Figure 5B:
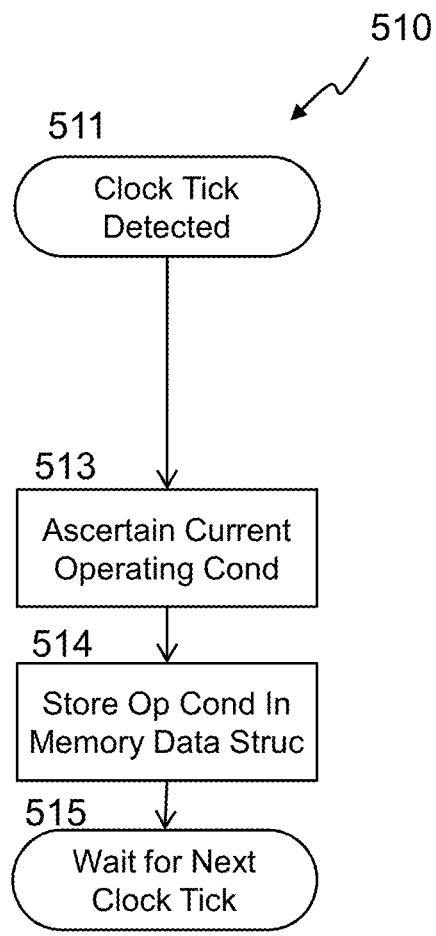

FIGS. 5A and 5B show flow charts 500, 510 for different embodiments of creating a log of operating conditions in the networked device. Other methods may also be used in other embodiments. In one embodiment 500 the controller 421 detects if the networked device undergoes a change 501 of current operating condition. A change of operating condition could be turning on, turning off (standby), changing volume, changing a fan speed, changing the heating level of a heating element, changing the brightness level, or any other change in the condition of the networking device that could impact the amount of power it uses. If a change of state is detected, the controller 421 gets 502 the current time from the timer operating as a function in the controller or in another device. The time does not need to be highly accurate or even set to a real world clock time; it just needs to allow relative values of the time to be compared to get an elapsed time convertible to hours. The controller 421 must then ascertain 503 the current operating condition of the networked device. In some embodiments, the controller 421 always knows the operating condition because it is controlling the operating condition. In other embodiment, the controller 421 must query other devices in the networked device, such as the LED driver 412, to ascertain the current operating condition. Once the current operating condition and time have been collected, a data point identifying the current operating condition and the time are stored 504 in a data structure in memory. The controller 421 then waits 505 for the next change of operating condition.

The flow chart 510 of FIG. 5B shows an alternative embodiment of creating a log of operating conditions. In the flow chart 510, a clock tick is generated at regular intervals and detected 511 by the controller 421. The clock tick can be generated using the same sort of means as the timer of the first embodiment discussed. For each clock tick, the current operating condition is ascertained 513 as described above and a data point describing the current operating condition is stored 514 into a data structure. With this method, the time is implicitly known based on the clock tick. The time between clock ticks may vary depending on the type of device, the accuracy required of the power estimation, how often the power usage will be queried, and the embodiment, but one clock tick every 10 minutes might be used in one embodiment. The controller 421 then waits 515 for the next clock tick.

The memory used for the data structure of the log of operating conditions may be a separate location in the same non-volatile memory 426 that holds the set of power usage data or in some embodiments, it may be a different memory device, volatile of non-volatile. The data structure may be a circular queue of fixed size determined at the time the instructions for the controller are created. In some embodiments, the data structure may be dynamic in size depending on the way the networking device is used. In some embodiments, the data structure may be a linked list or a table. It is clear to one skilled in the art that a log of operating conditions cannot be of infinite size due to storage limitations, so tradeoffs must be made in the design of a particular embodiment. In the case where a data point is created every 10 minutes as in the embodiment described above and where an 8 bit byte can sufficiently describe the operating condition, such as a brightness level at 0.5% granularity or less, a data structure of 256 bytes can hold a log containing over 42 hours of data before some data is lost. That would be adequate for an embodiment where it is expected that all devices will be queried by a centralized power management console at least once each day.

Figure 6:
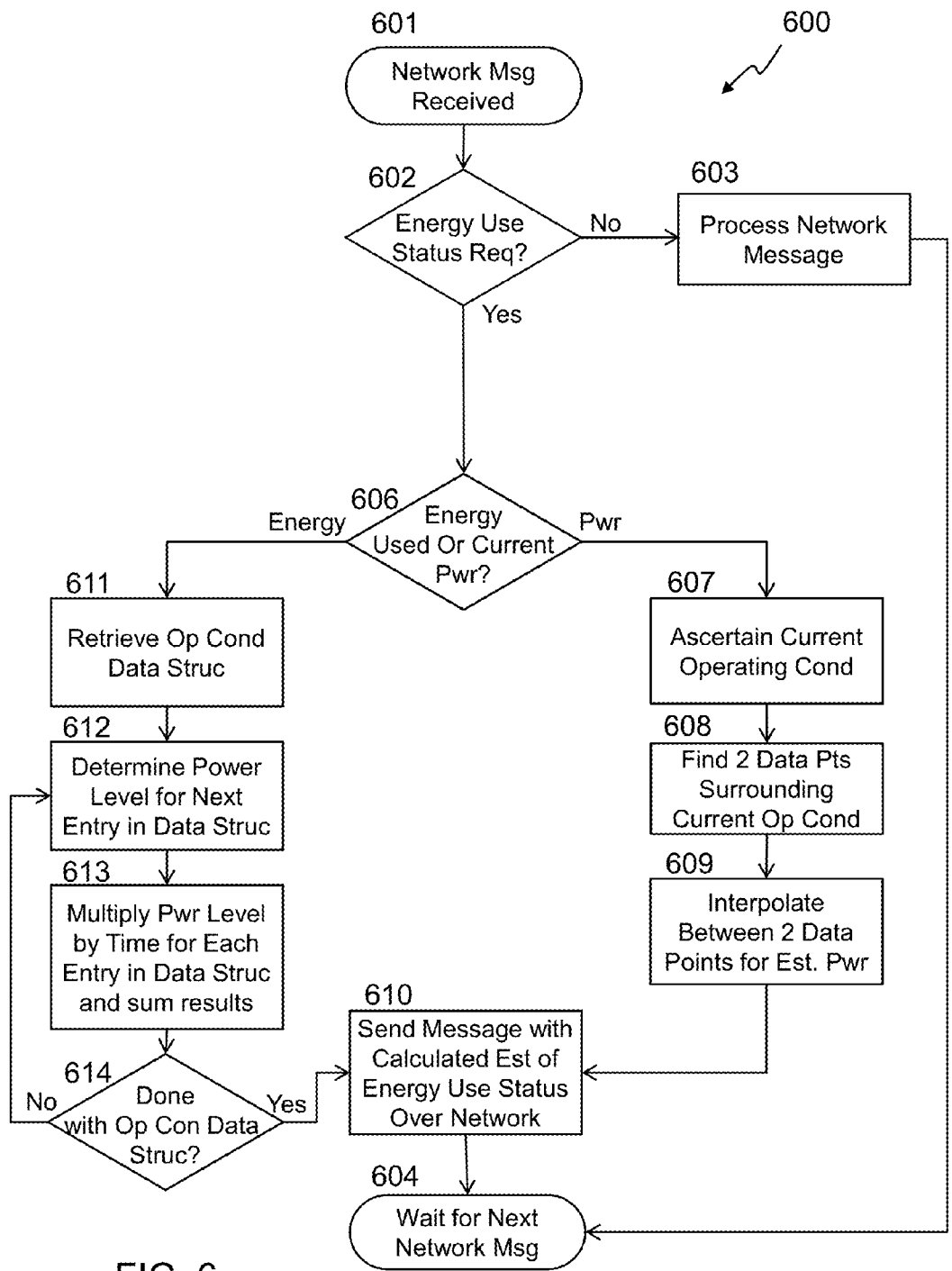
FIG. 6 shows a flowchart of how a networked device may estimate energy usage status.

FIG. 6 shows a flow chart 600 for calculating a best estimate of the energy usage status based on the set of power usage data stored in non-volatile memory 426. The network adapter 422 receives 601 a message from the network and relays it to the controller 421 which checks 602 to see if it is a request for energy usage status. If it is not, the controller 421 processes 603, whatever the message is, and then waits 604 for the next message. If it is a request for energy usage status, the controller 421 examines 606 the request to see if it is a request for the current power being used by the networked device or if it is a request for the amount of energy used over a given period of time. If it is a request for the current power used, several different techniques can be used, depending on the set of power usage data stored in non-volatile memory 426 and the accuracy required by a particular embodiment. The flow chart 600 shows a method where the controller 421 ascertains 607 the current operating condition of the networked device and then searches the set of power usage data to find 608 the two data points closest to the current operating condition. If one of the data points exactly matches a stored data point, the power given for that data point can directly become the estimate of current power used. If the current operating condition does not exactly match a data point from the set of power usage data, the controller 421 interpolates 609 between the two closest data points in the power usage data set. As an example for the networked light bulb 300, if the current operating condition is 60% brightness and the two closest data points are (50, 2.0) and (75, 2.5) the controller would determine that 60% brightness is 40% of the way between 50% brightness and 75% brightness and would then calculate the estimate of the current power by adding the power level at 50% to 40% of the difference between the power levels at 50% and 75% as shown in the following equation: 2.0+0.4*(2.5−2.0)=2.0+0.4*0.5=2.0+0.2=2.2 W. In other embodiments, the data point from the power usage data nearest to the current operating condition may be used instead of interpolating values, in this example, the 50% brightness operating condition leading to a power estimate of 2.0 W. In other embodiments where only a single point is included in the set of power usage data, that data point may be used as the estimated power for all cases where the networked device is considered "On" and zero (or some other low value determined by a constant when the instructions for the controller where created) used as the power estimation for cases where the networked device in "Off" or in standby mode. Once the estimation of the current power has been completed, the estimate is sent 610 over the network to the device that made the original request and the networked device then waits 604 for the next network message.

If the request is for the energy used over a period of time, the controller 421 retrieves 611 the log of operating conditions from memory. It must then determine the amount of time to use for the energy calculation. In some embodiments, the amount of time will be explicitly included with the request. In other embodiments the amount of time may be implicit, and the controller 421 then makes a calculation based on the instructions created at the time the networked device was designed. For this example, the request explicitly requests the power usage from the last hour. The controller starts with the most recent entry of the log of operating conditions and determines 612 the power used by the networked device at that operating condition using the methods described above for estimated the current power used. The power determined is then multiplied 613 by the amount of time (converted to hours) represented by that entry in the operating condition data structure. If the method of FIG. 5A was used, the time between the current time and the time stored in the data structure must be used for the first entry and the difference in the time entries between adjacent entries used for other entries. If the method of FIG. 5B was used, each entry constitutes an equal amount of time. If that method was used, an additional energy factor for the energy used between the last entry of the log and the current time may be added using the current operating condition for more accuracy in some embodiments. A running sum of the energy used for each entry in the log is kept. The time of the next entry in the log is examined 614 to see if enough data from the log has been analyzed to cover the period requested. If another entry is required, the power level for that entry is determined 612 and multiplied 613 by the time and summed. In some embodiments the amount of time for the operating condition entry will be determined by the length of time requested for the energy calculation. For example, if the first entry in the log of current operating conditions is from 4 hours ago because the networked device has not been used since then, the power estimation will multiply the power level for the operating condition stored in the first entry of the log multiplied 613 by 1 hour in the current example because that is the period requested, even though the first entry in the log is 4 hours earlier. In some embodiments, the networked device may not maintain a log of operating conditions. In those embodiments, the networked device may simply use the current operating condition as the operating condition for the entire period requested or may simply use a fixed average power usage value multiplied times the period to come up with an estimate. Once the estimation of the energy used has been completed, the estimate is sent 610 over the network to the device that made the original request and the networked device then waits 604 for the next network message.

Figure 7:
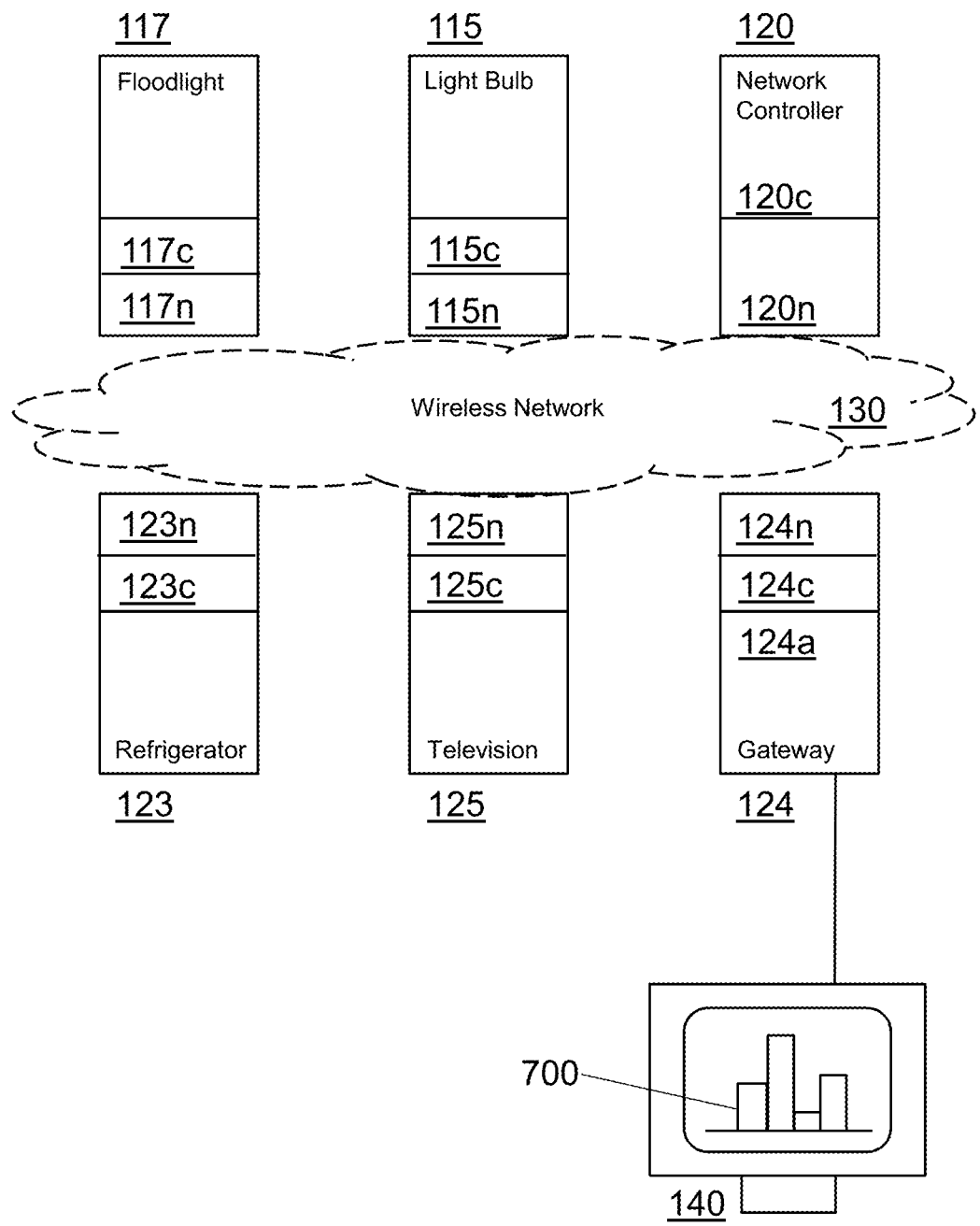
FIG. 7 shows a block diagram view of a network of home automation devices that can report and display their energy usage.

FIG. 7 shows a set of networked devices in the networked home 100 that is used for an example of how the energy usage status estimation methods described above may be used. A computer 140 running a power management console application with display 700 is connected to a gateway device 124. The gateway device 124 has a computer interface 124a that allows communication with a standard personal computer. The interface 124a can support any method of communication including but not limited to USB, Ethernet, IEEE-1394, Wi-Fi, Power line networking or any standard or proprietary communication means. The gateway device 124 has its own controller 124c and a network adapter 124n to allow it to connect to the network 130 and communicate with the networked devices 111-127. The power management console 700 may query the network controller 120, communicating with its controller 120c through its network adapter 120n, to determine what networked devices 111-127 are currently available on the network 130. For this example, the network controller 120 provides information to the power management console 700 that the light bulb 115, the floodlight 117, the refrigerator 123 and the television 125 are available and support energy usage status requests.

The power management console than sends a request for the energy used over the last 24 hours to the floodlight 117 because it has not been available for requests for some time and the power management console 700 does not have any recent information. The power usage request then goes through the network from the gateway's network adapter 124n to the floodlight's network adapter 117n. In this embodiment, the network is a mesh network so the message may be routed through other networked devices to be properly delivered to the floodlight 117 as described above in the descriptions of FIG. 1 and FIG. 2. Once the floodlight's controller 117c gets the request, it estimates the power used over the last 24 hours. In this example, the floodlight is not dimmable and it only has two entries in its set of power usage (0.05 & 15). Its first operating condition log entry was turning on 20 minutes ago and the next entry was turning off 36 hours earlier. So the controller uses that data to estimate an energy usage of 23.67*0.05+0.33*15=6.18 Wh and returns that information to the power management console 700 which may store the estimate in a database.

The power management console 700 then determines that it only needs the last 2 hours of energy usage from the networked light bulb 115, so it sends a request over the network 130 to the light bulb's network adapter 115n, the light bulb's controller 115c retrieves the log of operating conditions which has an entry every 15 minutes and shows that over the last 8 entries covering the two hour time period of interest, the light bulb has been at full brightness for 6 of those entries and at 30% brightness for the other two entries. The controller 115c then gets the set of power usage data and finds a single entry of 20 W so it estimates the energy used over the last two hours by interpolating the power used when the brightness was 30%. It interpolates between 0 and 20 W to get 6 W for a brightness level of 30% and multiplies it by the 0.5 hour time for two periods to come up with an estimate of 3 Wh used for that 0.5 hour time period. It then adds that to the energy used during the 1.5 hours that the light bulb was at full brightness, 20*1.5=30 Wh to get an estimate of 33 Wh used for the 2 hour time period and returns the estimate to the power management console 700.

The power management console 700 has been pre-programmed in this example to query the refrigerator 123 with network adapter 123n and controller 123c, and the television 125 with network adapter 125n and controller 125c only once every 24 hours and since the television 125 was queried 4 hours ago in this example, the power management console 700 does not query the television 125 at this point in time. It is due to query the refrigerator 123, so it sends a request for the energy used by the refrigerator over the last 24 hours over the network 130. The refrigerator's controller 123c receives the request from the network adapter 123n. The refrigerator's set of power usage data has a single data point giving the power used with the compressor is running (600 W). The log of operating conditions stores one entry each hour showing how many minutes the compressor has run. So the controller 123c goes through the last 24 entries of the log and multiplies the number of minutes of each entry by 600/60, accumulating the total, estimating that the refrigerator has used 800 Wh over the last 24 hours, and send the estimate to the power management console.

The power management console 700 may display the information it has received and stored in a database in many different ways to help the homeowner determine how to utilize her home in a way to be more "green". One display is a simple bar chart showing the energy used in the last month by each device. Other displays may show the highest peak users or the amount used by each networked device when electrical rates are at their highest. In some embodiments, the power management console 700 may be able to communicate with the networked electric meter 126 to get the total electrical usage of the home as well as possibly receive messages from the electrical utility. Different embodiments of the power management console 700 may provide a wealth of other information.

Figure 8:
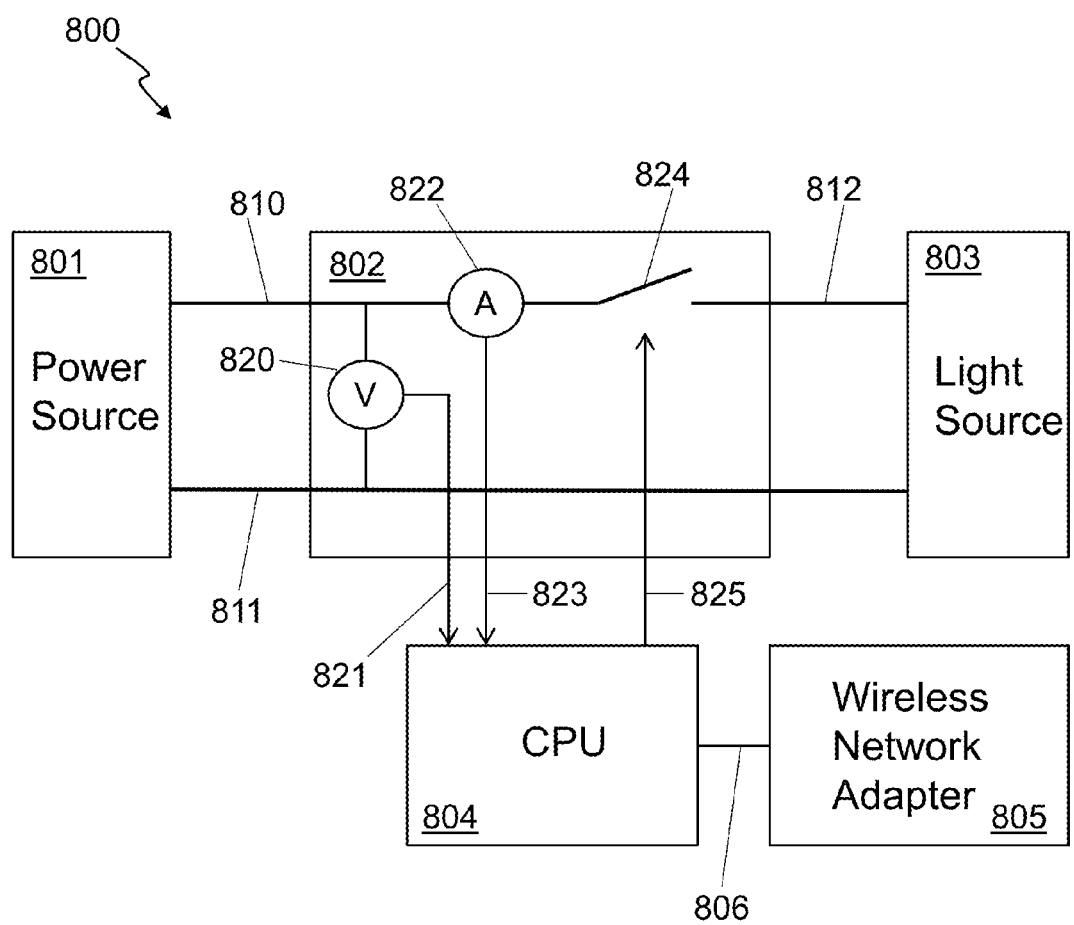
FIG. 8 shows a block diagram of a networked device that actually measures energy usage instead of estimating it.

The networked devices described thus far do not actually measure the power they use during normal operation. They simply estimate their power usage based on a set of power usage data stored in the networked device and readily available information on what the networked device is doing so that no additional circuitry is required to actually measure the power used. Some embodiments may determine that it is important to measure power used more accurately than can be estimated. FIG. 8 shows an embodiment of such as networked light bulb 800. The networked light bulb 800 is connected to a power source 801 and includes a light source 803, a CPU 804 and wireless network adapter 805 connected to the CPU by a digital bus 806. The CPU 804 of this embodiment includes memory that can be used for a log of power used. This networked light bulb 800 has included measurement circuitry 802 as well as including a switch 824 controlled by the CPU 804 using a control line 825. The measurement circuitry 802 also includes an ammeter 822 read by the CPU 804 through communication means 823 and a voltmeter 820 read by the CPU 804 through communication means 821. The light source 803 is connected to the power source with a neutral line 811 directly connected and the hot line 810 connected through the ammeter 822, switch 824 and a conductor 812. Whenever the switch 824 is closed, the ammeter 822 measures the current flowing through the light source 803 and the voltmeter 820 measures the voltage across the light source 803 from the hot line 810 to the neutral line 811. The CPU can the multiply the values received from the ammeter 822 through communication means 823 and the voltmeter 820 through communication means 821 to determine the actual current power being consumed by the light source 803. This may give the most accurate power reading possible, but the added expense and complexity may not be worth it in many instances. The estimation methods disclosed herein may give results that are nearly as accurate as actually measuring the power with no added circuitry beyond what is required for the other operations of the networked device.

Unless otherwise indicated, all numbers expressing quantities of elements, optical characteristic properties, and so forth used in the specification and claims are to be understood as being modified in all instances by the term "about." Accordingly, unless indicated to the contrary, the numerical parameters set forth in the preceding specification and attached claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The recitation of numerical ranges by endpoints includes all numbers subsumed within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. Thus, for example, reference to an element described as "an LED" may refer to a single LED, two LEDs or any other number of LEDs. As used in this specification and the appended claims, the term "or" is generally employed in its sense including "and/or" unless the content clearly dictates otherwise.

As used herein, the term "coupled" includes direct and indirect connections. Moreover, where first and second devices are coupled, intervening devices including active devices may be located there between.

Any element in a claim that does not explicitly state "means for" performing a specified function, or "step for" performing a specified function, is not to be interpreted as a "means" or "step" clause as specified in 35 U.S.C. §112, ¶ 6. In particular the use of "step of" in the claims is not intended to invoke the provision of 35 U.S.C. §112, ¶ 6.

The description of the various embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the intended scope of the present invention.

What is claimed is:

1. A method to determine energy usage status comprising:
retrieving a set of power usage data comprising information related to power usage of a networked device from a non-volatile memory located within the networked device, wherein the set of power usage data was stored in the non-volatile memory before the networked device was sold to an end customer; and
calculating, by the networked device, an estimate of energy usage status of the networked device based, at least in part, on the set of power usage data, without measuring electrical parameters of a power source of the networked device during normal use.

2. The method of claim 1, further comprising:
receiving a request for the energy usage status over a network; and
sending the estimate of the energy usage status over the network.

3. The method of claim 1, wherein the estimate of the energy usage status comprises an estimate of power usage at a point in time or an estimate of energy usage over a period of time.

4. An article of manufacture comprising at least one non-transitory computer readable medium having instructions stored thereon, that if executed by a processor in a networked device, result in:
retrieving a set of power usage data comprising information related to power usage of the networked device from a non-volatile memory located within the networked device, the set of power usage data having been previously stored in the non-volatile memory in advance of positioning the networked device for normal use; and
calculating an estimate of energy usage status of the networked device based, at least in part, on the set of power usage data, without measuring electrical parameters of a power source of the networked device during normal use.

5. The article of manufacture of claim 4, wherein the instructions, if executed by the processor, further result in:
receiving a request for the energy usage status over a network; and
sending the estimate of the energy usage status over the network.

6. The article of manufacture of claim 4, wherein the estimate of the energy usage status comprises an estimate of power usage at a point in time or an estimate of energy usage over a period of time.

7. The article of manufacture of claim 4, wherein the at least one non-transitory computer readable medium comprises the non-volatile memory.

8. The article of manufacture of claim 4, wherein the set of power usage data comprises two or more power usage data points corresponding to different operating conditions of the networked device.

9. The article of manufacture of claim 8, wherein the instructions, if executed by the processor, further result in:
maintaining a log of operating conditions of the networked device, without measuring the electrical parameters of the power source of the networked device; and
calculating the estimate of the energy usage status based, at least in part, on both the set of power usage data and the log operating conditions.

10. The article of manufacture of claim 8, wherein the networked device comprises a light bulb and the different operating conditions of the networked device comprise different brightness levels of the light bulb.

11. The article of manufacture of claim 10, wherein the instructions, if executed by the processor, further result in:
ascertaining a current brightness level of the light bulb by querying an LED driver in the light bulb; and
calculating the estimate of the energy usage status based, at least in part, on both the set of power usage data retrieved from the non-volatile memory and the current brightness level of the light bulb.

12. The article of manufacture of claim 8, wherein the different operating conditions of the networked device comprise at least a standby condition and a fully operational condition.

13. The article of manufacture of claim 8, wherein the instructions, if executed by the processor, further result in:
ascertaining a current operating condition of the networked device; and
calculating the estimate of the energy usage status by interpolating between two power usage points from the set of power usage data, the interpolating based, at least in part on different operating conditions associated with the two power usage points and the current operating condition of the networked device.

14. A networked device comprising:
memory storing a set of power usage data comprising information related to power usage of the networked device, the set of power usage data having been stored in the memory before positioning the networked device for normal use;
a processor coupled to the memory; and
a network interface coupled to the processor;
wherein the processor is configured to:
receive a request for energy usage status through the network interface;
generate a response to the energy usage status request based at least in part, on the set of power usage data, without measuring electrical parameters of a power source of the networked device during normal use; and
send the response through the network interface.

15. The networked device of claim 14, wherein the set of power usage data is based on measurements taken of actual power used by the networked device before the networked device is positioned for normal use.

16. The networked device of claim 14, wherein the set of power usage data is based on power used by similar networked devices.

17. The networked device of claim 14, wherein the set of power usage data comprises only one power usage data point.

18. The networked device of claim 14, wherein the response comprises an estimate of power usage at a point in time or an estimate of energy usage over a period of time.

19. The networked device of claim 14, wherein the processor is further configured to:
calculate an estimate of the energy usage status of the networked device for the response, based, at least in part, on the set of power usage data and a current operating condition of the networked device.

20. The networked device of claim 14, wherein the set of power usage data comprises two or more power usage data points based on different operating conditions of the networked device; and
wherein the processor is further configured to calculate an estimate of the energy usage status of the networked device for the response, based, at least in part, on the set of power usage data.

21. The networked device of claim 20, wherein the processor is further configured to:
maintain a log of operating conditions of the networked device, without measuring the electrical parameters of the power source of the networked device; and
calculate the estimate of the energy usage status based, at least in part, on both the set of power usage data and the log of operating conditions.

22. The networked device of claim 20, wherein the networked device is a networked light bulb and the different operating conditions of the networked device comprise different brightness levels of the networked light bulb.

23. The networked device of claim 22, further comprising:
at least one LED; and
wherein the processor is further configured to calculate the estimate of the energy usage status based, at least in part, on a current brightness level of the at least one LED in conjunction with the set of power usage data.

24. The networked device of claim 23, further comprising:
an LED driver;
wherein the processor is further configured to query the LED driver to determine the current brightness level of the at least one LED.

25. The networked device of claim 20, wherein the different operating conditions of the networked device comprise at least a standby condition and a fully operational condition.

26. The networked device of claim 20, wherein the processor is further configured to:
select at least two power usage points associated with at least two operating conditions from the set of power usage points, based, at least in part, on a current operating condition of the networked device;
interpolate between the at least two power usage points based, at least in part, on the at least two operating conditions and the current operating condition of the networked device to calculate the estimate of the energy usage status.

27. The networked device of claim 20, wherein the network interface is configured to communicate over a network utilizing radio frequency communication.

28. The networked device of claim 20, in which at least the processor and at least a portion of the network interface are integrated on a single integrated circuit.

* * * * *